United States Patent
Fu et al.

(10) Patent No.: US 6,251,242 B1
(45) Date of Patent: *Jun. 26, 2001

(54) MAGNETRON AND TARGET PRODUCING AN EXTENDED PLASMA REGION IN A SPUTTER REACTOR

(75) Inventors: Jianming Fu, San Jose; Praburam Gopalraja, Sunnyvale, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/490,026

(22) Filed: Jan. 21, 2000

(51) Int. Cl.⁷ ............................. C23C 14/35; C23C 14/34
(52) U.S. Cl. ................. 204/298.19; 204/298.19; 204/298.2; 204/298.21; 204/298.22; 204/298.16; 204/298.17; 204/298.18; 204/298.12; 204/192.2; 204/298.08
(58) Field of Search ............................ 204/298.19, 298.2, 204/298.21, 298.22, 298.16, 298.17, 298.18, 298.12, 192.12, 298.08

(56) References Cited

U.S. PATENT DOCUMENTS

| | | | |
|---|---|---|---|
| 5,178,739 | 1/1993 | Barnes et al. | 204/192.12 |
| 5,482,611 | 1/1996 | Helmer et al. | 204/298.17 |
| 5,512,150 | * 4/1996 | Bourez et al. | 204/298.19 |
| 5,589,041 | 12/1996 | Lantsman | 204/192.33 |
| 5,685,959 | * 11/1997 | Bourez et al. | 204/298.2 |
| 5,865,961 | * 2/1999 | Yokoyama et al. | 204/298.17 |
| 6,080,284 | * 6/2000 | Miyaura | 204/298.08 |

OTHER PUBLICATIONS

Kitamoto et al., "Compact sputtering apparatus for depositing Co–Cr alloy thin films in magnetic disk," Proceedings: The Fourth International Symposium on Sputtering & Plasma Processes, Kanazawa, Japan, Jun. 4–6, 1997, pp. 519–522.

Yamazato et al., "Preparation of TiN thin films by facing targets magnetron sputtering," Proceedings: The Fourth International Symposium on Sputtering & Plasma Processes, Kanazawa, Japan Jun. 4–6, 1997 pp. 635–638.

Musil et al., "Unbalanced magnetrons and new sputtering systems with enhanced plasma ionization," *Journal of Vacuum Science and Technology A*, vol. 9, No. 3, May/Jun. 1991, pp. 1171–1177.

Matsuoka et al., "Dense plasma production and film deposition by new high–rate sputtering using an electric mirror," *Journal of Vacuum Science and Technology A*, vol. 7, No. 4, Jul./Aug. 1989, pp. 2652–2657.

* cited by examiner

*Primary Examiner*—Mark F. Huff
*Assistant Examiner*—Daborah Chacko-Davis
(74) *Attorney, Agent, or Firm*—Charles S. Guenzer

(57) ABSTRACT

A target and magnetron for a plasma sputter reactor. The target has an annular trough facing the wafer to be sputter coated. Various types of magnetic means positioned around the trough create a magnetic field supporting a plasma extending over a large volume of the trough. For example, the magnetic means may include magnets disposed on one side within a radially inner wall of the trough and on another side outside of a radially outer wall of the trough to create a magnetic field extending across the trough, to thereby support a high-density plasma extending from the top to the bottom of the trough. The large plasma volume increases the probability that the sputtered metal atoms will become ionized. The magnetic means may include a magnetic coil, may include additional magnets in back of the trough top wall to increase sputtering there, and may include confinement magnets near the bottom of the trough sidewalls. The magnets in back of the top wall may have an outer magnet surrounding an inner magnet of the opposite polarity. The high aspect ratio of the trough also reduces asymmetry in coating the sidewalls of a deep hole at the edge of the wafer.

35 Claims, 7 Drawing Sheets

MAGNETRON AND TARGET PRODUCING AN EXTENDED PLASMA REGION IN A SPUTTER REACTOR

FIELD OF THE INVENTION

The invention relates generally to a plasma sputter reactor. In particular, the invention relates to the sputter target and associated magnetron used in a sputter reactor.

BACKGROUND ART

A semiconductor integrated circuit contains many layers of different materials usually classified according to whether the layer is a semiconductor, a dielectric (electrical insulator) or metal. However, some materials such as barrier materials, for example, TiN, are not so easily classified. The two principal current means of depositing metals and barrier materials are sputtering, also referred to as physical vapor deposition (PVD), and chemical vapor deposition (CVD). Of the two, sputtering has the inherent advantages of low cost source material and high deposition rates. However, sputtering has an inherent disadvantage when a material needs to filled into a deep narrow hole, that is, one having a high aspect ratio, or coated onto the sides of the hole, which is often required for barrier materials. Sputtering itself is primarily a nearly isotropic process producing ballistic sputter particles which do not easily reach the bottom of deep narrow holes. On the other hand, CVD tends to be a conformal process equally effective at the bottom of holes and on exposed top planar surfaces.

The conventional sputter reactor has a planar target in parallel opposition to the wafer being sputter deposited. A negative DC voltage is applied to the target sufficient to ionize the argon working gas into a plasma. The positive argon ions are attracted to the negatively charged target with sufficient energy to sputter atoms of the target material. Some of the sputtered atoms strike the wafer and form a sputter coating thereon. Most usually a magnetron is positioned in back of the target to create a magnetic field adjacent to the target. The magnetic field traps electrons, and, to maintain charge neutrality in the plasma, the ion density increases also. As a result, the plasma density and sputter rate are increased. The conventional magnetron generates a magnetic field principally lying parallel to the target.

Much effort has been expended to allow sputtering to effectively coat metals and barrier materials deep into narrow holes. High-density plasma (HDP) sputtering has been developed in which the argon working gas is excited into a high-density plasma, which is defined as a plasma having an ionization density of at least $10^{11}$ cm$^{-3}$ across the entire space the plasma fills except the plasma sheath. Typically, an HDP sputter reactor uses an RF power source connected to an inductive coil adjacent to the plasma region to generate the high-density plasma. The high argon ion density causes a significant fraction of sputtered atoms to be ionized. If the pedestal electrode supporting the wafer being sputter coated is negatively electrically biased, the ionized sputter particles are accelerated toward the wafer to form a directional beam that reaches deeply into narrow holes.

HDP sputter reactors, however, have disadvantages. They involve a relatively new technology and are relatively expensive. Furthermore, the quality of the sputtered films they produce is often not the best, typically having an undulatory surface. Also, high-energy sputter ions tend to damage the material already deposited.

Another sputtering technology, referred to as self-ionized plasma (SIP) sputtering, has been developed to fill deep holes. See, for example, U.S. patent application Ser. No. 09/373,097 filed Aug. 12, 1999 by Fu and U.S. patent application filed Oct. 8, 1999 by Chiang et al. Both of these patent applications are incorporated by reference in their entireties. In its original implementations, SIP relies upon a somewhat standard capacitively coupled plasma sputter reactor having a planar target in parallel opposition to the wafer being sputter coated and a magnetron positioned in back of the target to increase the plasma density and hence the sputtering rate. The SIP technology, however, is characterized by a high target power density, a small magnetron, and a magnetron having an outer magnetic pole piece enclosing an inner magnetic pole piece with the outer pole piece having a significantly higher total magnetic flux than the inner pole piece. In some implementations, the target is separated from the wafer by a large distance to effect long-throw sputtering, which enhances collimated sputtering. The asymmetric magnetic pole pieces causes the magnetic field to have a significant vertical component extending far towards the wafer, thus enhancing extending the high-density plasma volume and promoting transport of ionized sputter particles.

The SIP technology was originally developed for sustained self-sputtering (SSS) in which a sufficiently high number of sputter particles are ionized that they may be used to further sputter the target and no argon working gas is required. Of the metals commonly used in semiconductor fabrication, only copper is susceptible to SSS resulting from its high self-sputtering yield.

The extremely low pressures and relatively high ionization fractions associated with SSS are advantageous for filling deep holes with copper. However, it was quickly realized that the SIP technology could be advantageously applied to the sputtering of aluminum and other metals and even to copper sputtering at moderate pressures. SIP sputtering produces high quality films exhibiting high hole filling factors regardless of the material being sputtered.

Nonetheless, SIP has some disadvantages. The small area of the magnetron requires circumferential scanning of the magnetron in a rotary motion at the back of the target. Even with rotary scanning, radial uniformity is difficult to achieve. Furthermore, very high target powers have been required in the previously known versions of SIP. High-capacity power supplies are expensive and necessitate complicated target cooling. Lastly, known versions of SIP tend to produce a relatively low ionization fraction of sputter particles, for example, 20%. The non-ionized fraction has a relatively isotropic distribution rather than forming a forward directed beam as the ionized particles are accelerated toward a biased wafer. Also, the target diameter is typically only slightly greater than the wafer diameter. As a result, those holes being coated located at the edge of the wafer have radially outer sidewalls which see a larger fraction of the wafer and are more heavily coated than the radially inner sidewalls. Therefore, the sidewalls of the edge holes are asymmetrically coated.

Other sputter geometries have been developed which increase the ionization density. One example is a multi-pole hollow cathode target, several variants of which are disclosed by Barnes et al. in U.S. Pat. No. 5,178,739. Its target has a hollow cylindrical shape, usually closed with a circular back wall, and is electrically biased. Typically, a series of magnets, positioned on the sides of the cylindrical cathode of alternating magnetic polarization, create a magnetic field extending generally parallel to the cylindrical sidewall. Helmer et al. in U.S. Pat. No. 5,482,611 disclose a hollow cathode target in which an axially polarized tubular magnet surrounds the sides of the hollow cathode and extend in back of the cathode back wall to create a generally axial magnetic field but which forms a cusp at the cathode back wall Another approach uses a pair of facing targets facing the lateral sides of the plasma space above the wafer. Such systems are described, for example, by Kitamoto et al. in "Compact sputtering apparatus for depositing Co—Cr alloy thin films in magnetic disks," *Proceedings: The Fourth International Symposium on Sputtering & Plasma Processes,* Kanazawa, Japan, Jun. 4–6, 1997, pp. 519–522, by Yamazato et al. in "Preparation of TiN thin films by facing targets magnetron sputtering, ibid., pp. 635–638, and by Musil et al. in "Unbalanced magnetrons and new sputtering systems with enhanced plasma ionization," *Journal of Vacuum Science and Technology A,* vol. 9, no. 3, May 1991, pp. 1171–1177. The facing pair geometry has the disadvantage that the magnets are stationary and create a horizontally extending field that is inherently non-uniform with respect to the wafer.

Musil et al., ibid., pp.1174, 1175 describe a coil-driven magnetic mirror magnetron having a central post of one magnetic polarization and surrounding rim of another polarization. An annular trough-shaped target is placed between the two post and rim. This structure has the disadvantage that the soft magnetic material forming the two poles, particularly the central spindle, are exposed to the plasma during sputtering and inevitably contaminate the sputtered layer. Furthermore, the coil drive provides a substantially cylindrical geometry, which may not be desired in some situations. Also, the disclosure illustrates a relatively shallow geometry for the target trough, which does not take advantage of some possible beneficial effects for a concavely shaped target.

It is thus desired to combine many of the good benefits of the different plasma sputter reactors described above while avoiding their separate disadvantages.

SUMMARY OF THE INVENTION

The invention includes a magnetron producing a large volume or thickness of a plasma, preferably a high-density plasma. The long travel path through the plasma volume allows a large fraction of the sputtered atoms to be ionized so that their energy and directionality can be controlled by substrate biasing.

In one embodiment of the invention, the target includes at least one annular vault on the front side of the target. The backside of the target includes a central well enclosed by the trough and accommodating an inner magnetic pole of one polarity. The backside of the target also includes an outer annular space surrounding the trough and accommodating an outer magnetic pole of a second polarity. The outer magnetic pole may be annular or be a circular segment which is rotated about the inner magnetic pole.

In one embodiment, the magnetization of the two poles may be accomplished by soft pole pieces projecting into the central well and the outer annular space and magnetically coupled to magnets disposed generally behind the well and outer annular space. In a second embodiment, the two poles may be radially directed magnetic directions. In a third embodiment, a magnetic coil drives a yoke having a spindle and rim shape.

In one advantageous aspect of the invention, the target covers both the spindle and the rim of the yoke as well as forming the vault, thereby eliminating any yoke sputtering.

According to another aspect of the invention, the relative amount of sputtering of the top wall of the inverted trough relative to the sidewalls may be controlled by increasing the magnetic flux in the area of the top wall. An increase of magnetic flux at the sidewalls may result in a predominantly radial distribution of magnetic field between the two sidewalls, resulting in large sputtering of the sidewalls.

One approach for increasing the sputtering of the top wall places additional magnets above the top wall with magnetic polarities aligned with the magnets just outside of the trough sidewalls. Another approach uses only the top wall magnets to the exclusion of the sidewall magnets. In this approach, the back of the target can be planar with no indentations for the central well or the exterior of the vault sidewalls. In yet another approach, vertically magnets are positioned near the bottom of the vault sidewalls with magnetic polarities opposed to the corresponding magnets near the top of the vault sidewalls, thereby creating semi-toroidal fields near the bottom sidewalls. Such fields can be adjusted either for sputtering or for primarily extending the top wall plasma toward the bottom of the vault and repelling its electrons from the sidewalls. A yet further approach scans over top wall a small, closed magnetron having a central magnetic pole of one polarity and a surrounding magnetic pole of the other polarity.

The target may be formed with more than one annular vault on the side facing the substrate. Each vault should have a width of at least 2.5 cm, preferably at least 5 cm, and more preferably at least 10 cm. The width is thus at least 10 times and preferably at least 25 times the dark space, thereby allowing the plasma sheath to conform to the vault outline.

DETAILED DESCRIPTION OF THE PREFERRED EMBODIMENTS

The invention uses a complexly shaped sputter target and a specially shaped magnetron which have the combined effect of impressing a magnetic field producing a thick region of relatively high plasma density. As a result, a large fraction of the atoms sputtered from the target can be ionized as they pass through the plasma region. Ionized sputtered particles can be advantageously controlled by substrate biasing to coat the walls of a deep, narrow hole.

Figure 1:
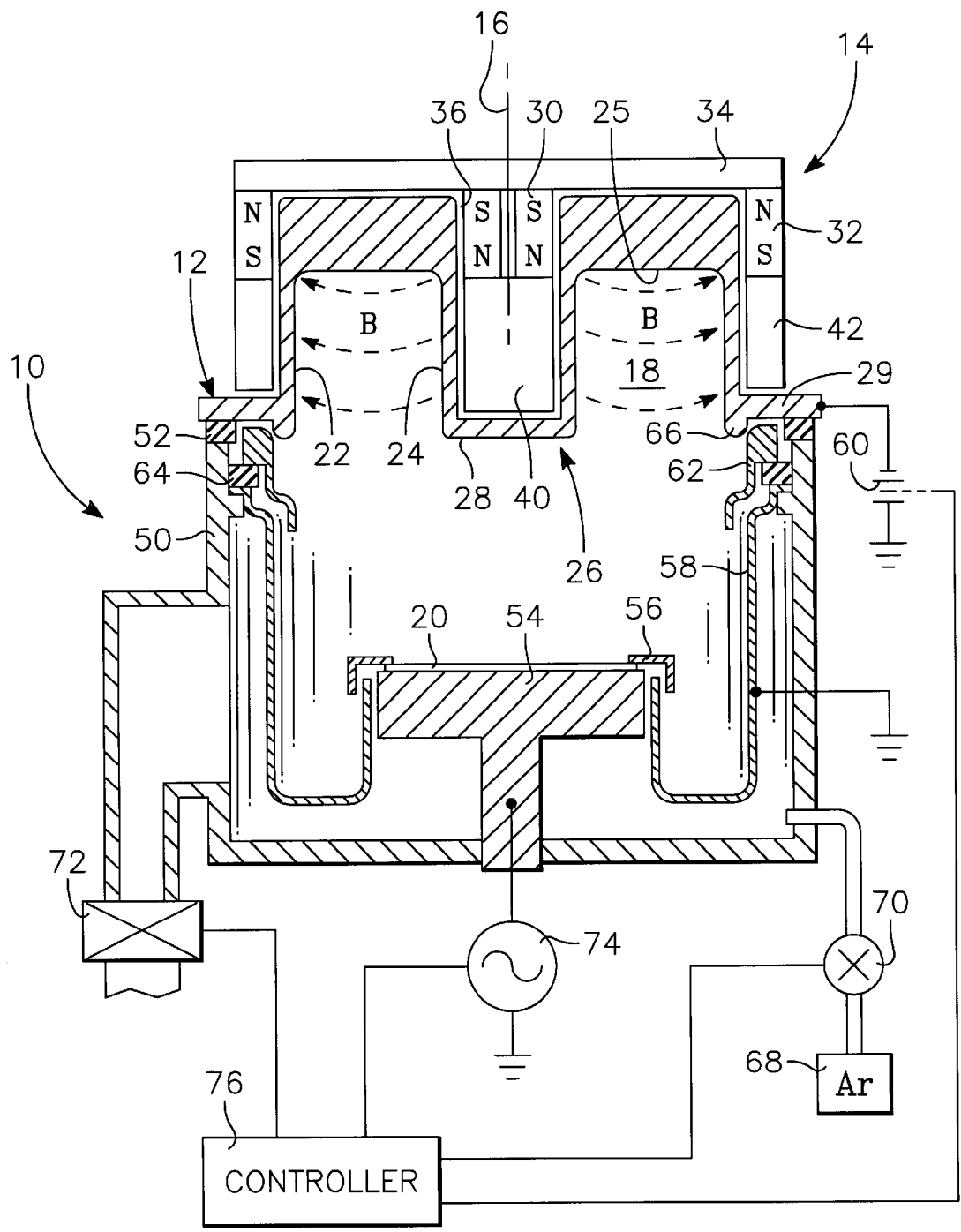
FIG. 1 is a schematic cross-sectional view of a first embodiment of a magnetron sputter reactor of the invention using a stationary, circularly symmetric magnetron.

A magnetron sputter reactor 10 of a first embodiment is illustrated in the schematic cross-sectional view of FIG. 1. It includes a specially shaped sputter target 12 and magnetron 14 symmetrically arranged about a central axis 16 in a reactor otherwise described for the most part by Chiang et al. in the above referenced patent. The target 12 or at least its interior surface is composed of the material to be sputter deposited. The invention is particularly useful for sputtering copper, but it may be applied to other sputtering materials as well. As is known, reactive sputtering of materials like TiN and TaN can be accomplished by using a Ti or Ta target and including gaseous nitrogen in the plasma. Other combinations of metal targets and reactive gases are possible. The target 12 includes an annularly shaped downwardly facing vault 18 facing a wafer 20 being sputter coated. The vault 18 may be alternatively characterized as an annular downwardly facing trough. The vault 18 has an aspect ratio of its depth to radial width of at least 1:2 and preferably at least 1:1. The vault 18 has an outer sidewall 22 outside of the periphery of the wafer 20, an inner sidewall 24 overlying the wafer 20, and a generally flat vault top wall or roof 25 (which closes the bottom of the downwardly facing vault 18). The target 12 includes a central portion forming a post 26 including the inner sidewall 24 and a generally planar face 28 in parallel opposition to the wafer 20. The target 12 also includes a flange 29 that is vacuum sealed to the chamber body of the sputter reactor 10.

The magnetron 14 illustrated in FIG. 1 includes one or more central magnets 30 having a first vertical magnetic polarization and one or more outer magnets 32 of a second vertical magnetic polarization opposite the first polarization and arranged in an annular pattern. In this embodiment the magnets 30, 32 are permanent magnets, that is, composed of strongly ferromagnetic material. The inner magnets 30 are disposed within a cylindrical central well 36 formed between the opposed portions of the inner target sidewall 24 while the outer magnets 32 are disposed generally radially outside of the outer target sidewall 22. A circular magnetic yoke 34 magnetically couples tops of the inner and outer magnets 30, 32. The yoke is composed of a magnetically soft material, for example, a paramagnetic material, such as SS410 stainless steel, that can be magnetized to thereby form a magnetic circuit for the magnetism produced by the permanent magnet 30, 32. Permanently magnetized yokes are possible but are difficult to obtain in a circular geometry.

A cylindrical inner pole piece 40 of a similarly magnetically soft material abuts the lower ends of the inner magnets 30 and extend deep within the target well 36 adjacent to the inner target sidewall 24. If the magnetron 14 is generally circularly symmetric, it is not necessary to rotate it for uniformity of sputter deposition. A tubular outer pole piece 42 of a magnetically soft material abuts the lower end of the outer magnets 32 and extends downwardly outside of the outer target sidewall 22. The magnetic pole pieces 40, 42 of FIG. 1 differ from the usual pole faces in that they and the magnets 30, 32 are configured and sized to emit a magnetic field B in the target vault 18 that is largely perpendicular to the magnetic field of the corresponding associated magnets 30, 32. In particular, the magnetic field B is generally perpendicular to the target vault sidewalls 22, 24.

This configuration has several advantages. First, the electrons trapped by the magnetic field B, although gyrating about the field lines, otherwise travel generally horizontally and radially with respect tot he target central axis 16. The electrons strike the target sidewalls 22, 24 and are re-emitted at angles generally isotropic with respect to the magnetic field B. That is, electron loss is minimized, thus increasing the plasma density. Secondly, the depth of the magnetic field B is determined by the height of the target sidewalls 22, 24. This depth can be considerably greater than that of a high-density plasma region created by magnets in back of a planar target. As a result, sputtered atoms traverse a larger region of a high-density plasma and are accordingly more likely to become ionized. The support structure for the magnetron 14 and its parts is not illustrated but can be easily designed by the ordinary mechanic.

The remainder of the sputter reactor 10 is similar to that described by Chiang et al. in the above referenced patent application although a short-throw rather than a long-throw configuration may be used. The target 12 is vacuum sealed to a grounded vacuum chamber body 50 through a dielectric target isolator 52. The wafer 20 is clamped to a heater pedestal electrode 54 by, for example, a clamp ring 56 although electrostatic chucking is possible. An electrically grounded shield 58 acts as an anode with respect to the cathode target 12, which is negatively biased by a power supply 60. DC magnetron sputtering is conventional in commercial applications, but RF sputtering can enjoy the advantages of the target and magnetron of the invention and is especially advantageous for sputtering non-metallic targets. An electrically floating shield 62 is supported on the electrically grounded shield 58 or chamber 50 by a dielectric shield isolator 64. A annular knob 66 extending downwardly from the outer target sidewall 22 and positioned inwardly of the uppermost part of the floating shield 62 protects the upper portion of the floating shield 62 and the target isolator 52 from being sputter deposited from the strong plasma disposed within the target trough 18. The gap between the upper portion of the floating shield 62 and the target knob 66 and flange 12 is small enough to act as a dark space preventing the plasma from propagating into the gap.

A working gas such as argon is supplied into the chamber from a gas source 68 through a mass flow controller 70. A vacuum pumping system 72 maintains the chamber at a reduced pressure, typically a base pressure in the neighborhood of $10^{-8}$ Torr. Although a floating pedestal electrode 54 can develop a desired negative self-bias, it is typical in SIP sputtering for an RF power supply 74 to RF bias the pedestal electrode 54 through an isolation capacitor, which results in a negative DC self-bias. A controller 76 regulates the power supplies 60, 74, mass flow controller 70, and vacuum system 72 according to a sputtering recipe prerecorded in it.

The target and magnetron structure has several advantages. As mentioned previously, secondary electrons are largely trapped within the vault 18 with little loss even upon collision with the target sidewalls 22, 24. Also, the plasma thickness is relatively large, determined by the sidewall heights, thereby increasing the ionization fraction of the sputtered target atoms. The separation of the inner and outer poles 40, 42 is relatively small, thereby increasing the magnetic field intensity within the vault 18. The target 12 is continuous across the pole pieces 40, 42, thus preventing the magnetic material of the poles from being sputtered and deposited on the semiconductor wafer 20.

Figure 2:
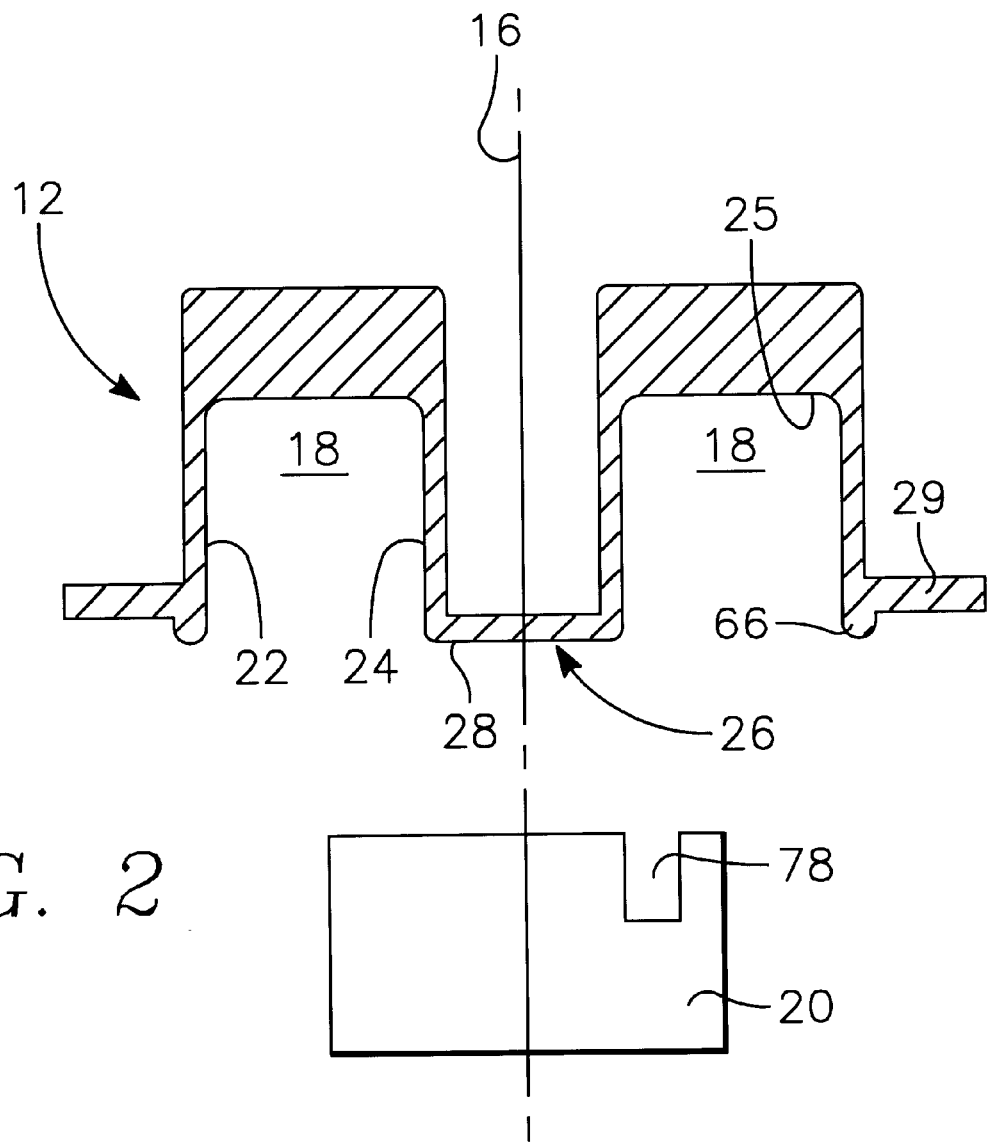
FIG. 2 is a schematic cross-sectional diagram illustrating the collimating function of the target of the invention.

The high aspect ratio of the vault 18 also improves the symmetric filling of holes located near the edge of the wafer, particularly in configurations having a shorter throw than that illustrated in FIG. 1. As schematically illustrated in FIG. 2, a hole 78 located at the right edge of the wafer 20 is to have a conformal layer sputter deposited on its sides. The size of the hole 78 and the thickness of the wafer 20 are greatly exaggerated, but the geometry remains approximately valid. If a planar target were being used, the right side of the wafer hole 78 would see a much larger fraction of the target than the left side and would thus be coated with a commensurately thicker layer. However, with the vault-shaped target 12, the hole 78 sees neither the inner sidewall 24 of the left side of the vault 18 nor the vault top wall 25. Even the upper portion of the outer sidewall 22 of the left side of the vault 18 is shielded from the wafer hole 78 by the inner sidewall 24 of the left side of the vault 18. As a result, the two sidewalls of the hole 78 to be coated see areas of the vault-shaped target that much closer in size than for a planar target, and the sidewall coating symmetry is thereby greatly increased.

The target structure, as a result, provides a degree of collimation but without an apertured collimator which tends to become clogged with sputtered material. The effect is increased by a high aspect ratio for the trough, preferably at least 1:1.

Figure 3:
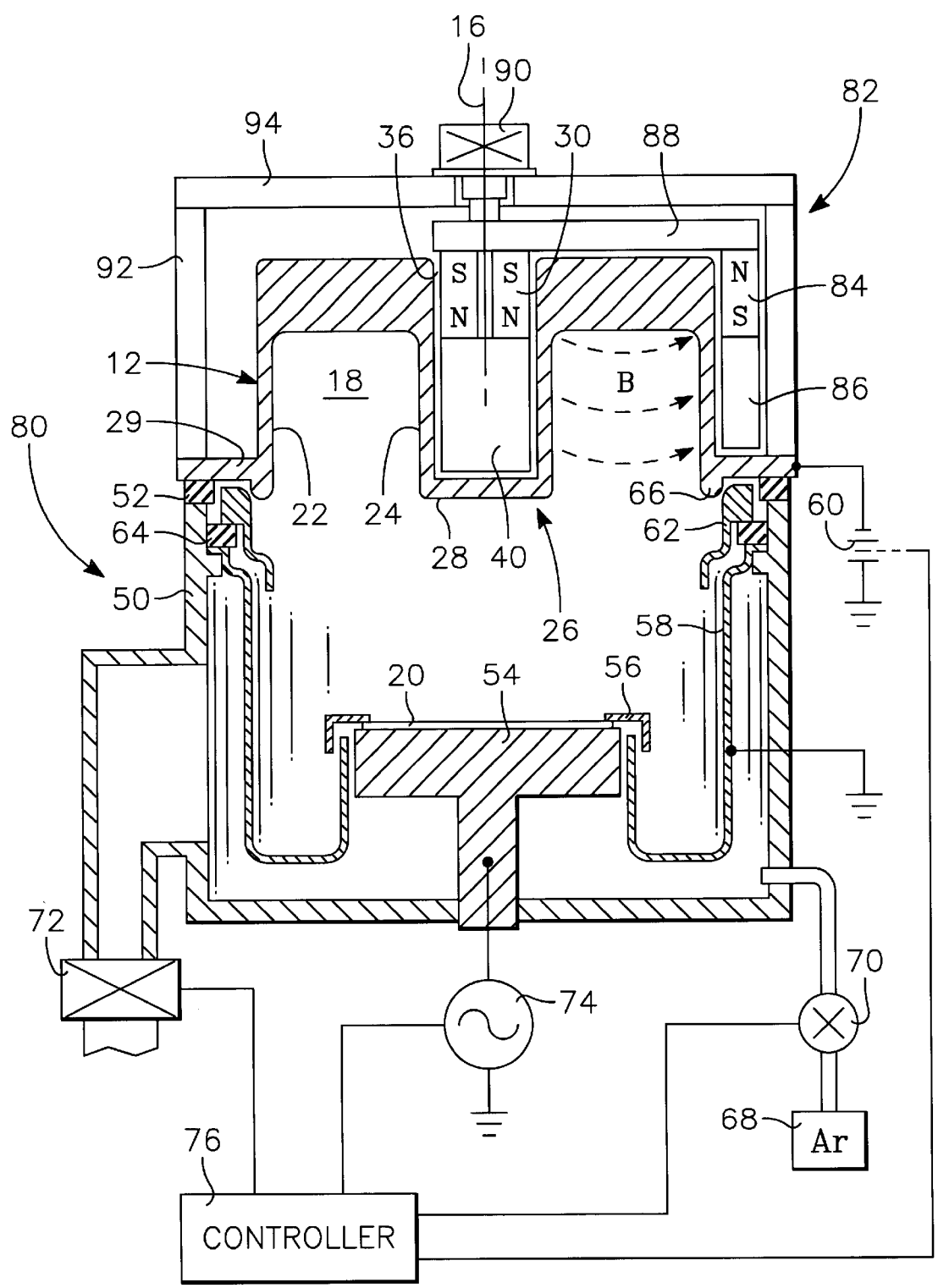
FIG. 3 is a schematic cross-sectional view of a second embodiment of a magnetron sputter reactor of the invention using a rotating, segmented magnetron with vertically magnetized magnets.

A sputter reactor 80 of second embodiment of the invention is illustrated in the schematic cross-sectional view of FIG. 3. A magnetron 82 includes the previously described inner magnets 30 and inner pole piece 40. However, one or more outer magnets 84 and an outer pole piece 86 extend around only a segment of the circumference of the target, for example between 15° and 90°. An asymmetric magnetic yoke 88 shaped as a sector magnetically couples the inner and outer magnets 30, 84 but only on the side of target well 36 toward the outer magnets 84. As a result, a high-density plasma is generated in only a small circumferential portion of the target vault 18. For self-ionized plating (SIP) and particularly sustained self-sputtering (SSS), a high plasma density is desired. In view of the limited capacity of realistic power supplies 60, the high plasma density can be achieved by reducing the area of the magnetron 82.

To achieve uniform sputtering, a motor 90 is supported on the chamber body 50 through a cylindrical sidewall 92 and roof 94 preferably electrically isolated from the biased target flange 29. The motor 90 has a motor shaft connected to the yoke 88 at the target axis 16 and rotates the magnetron 82 about that axis 16 at a few hundred rpm. Mechanical counterbalancing may be provided to reduce vibration in the rotation of the axially offset magnetron 82.

Figure 4:
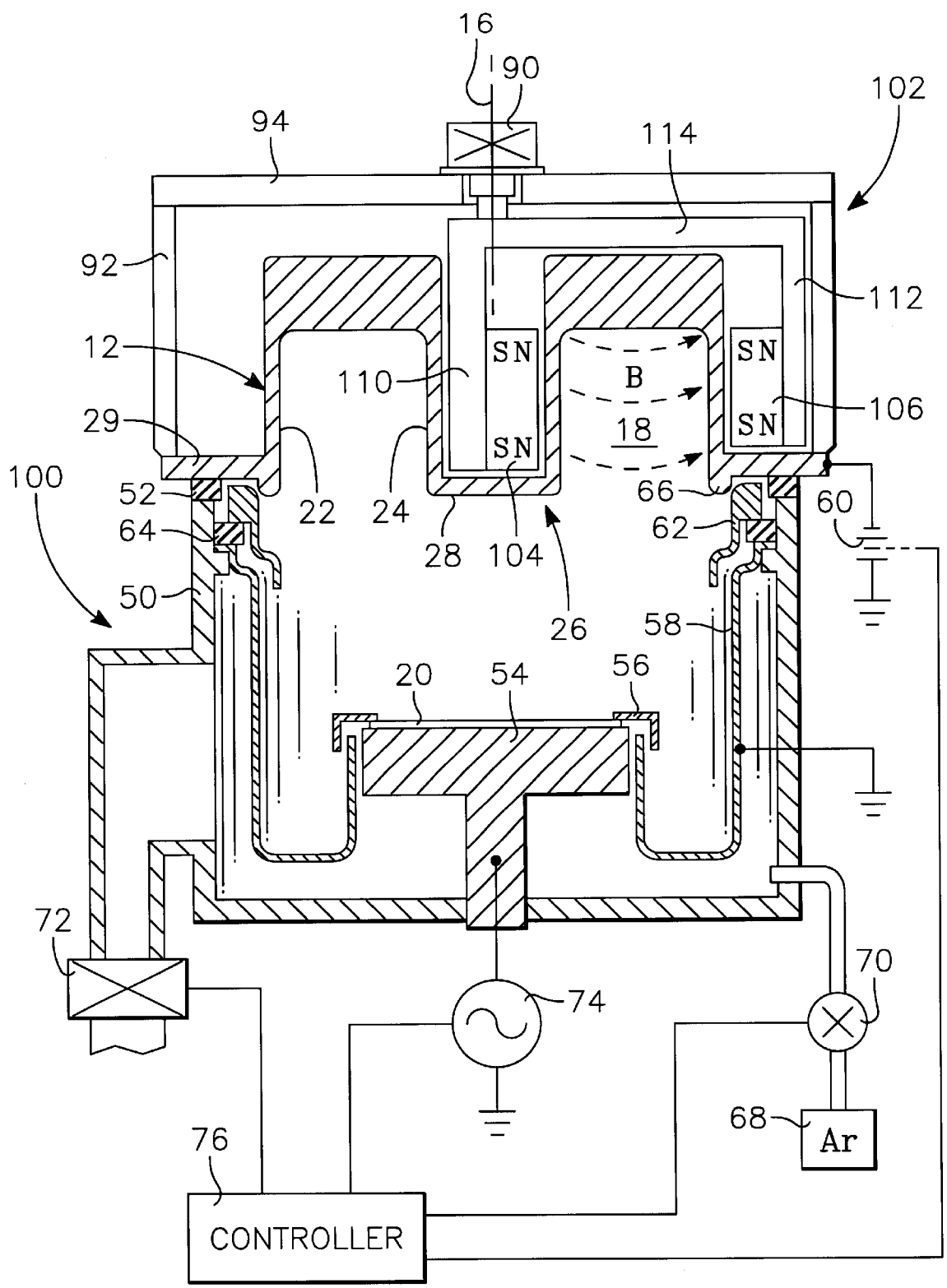
FIG. 4 is a schematic cross-sectional view of a third embodiment of a magnetron sputter reactor of the invention using a rotating, segmented magnetron with radially magnetized magnets.

Other magnet configurations are possible to produce similar magnetic field distributions. A sputter reactor 100 of a third embodiment of the invention is illustrated in the schematic cross-sectional view of FIG. 4. A magnetron 102 includes an inner magnet 104 having a magnetization direction generally aligned with a radius of the target 12 about the target axis 16. One or more outer magnets 106 is similarly radially magnetized but anti-parallel to the magnetization of the inner magnet 104 with respect to the vault 18. A C-shaped magnetic yoke has two arms 110, 112 in back of and supporting the respective magnets 104, 106 and a connector 114 supported on and rotated by the shaft of the motor 90.

The magnets 104, 106 may be advantageously positioned only on reduced circumferential portions of the sidewalls 24, 22 of the target vault 18 so as to concentrate the magnetic field there. Furthermore, in this configuration extending along only a small segment of the target periphery, the magnets 104, 106 may be conveniently formed of plate magnets.

Figure 5:
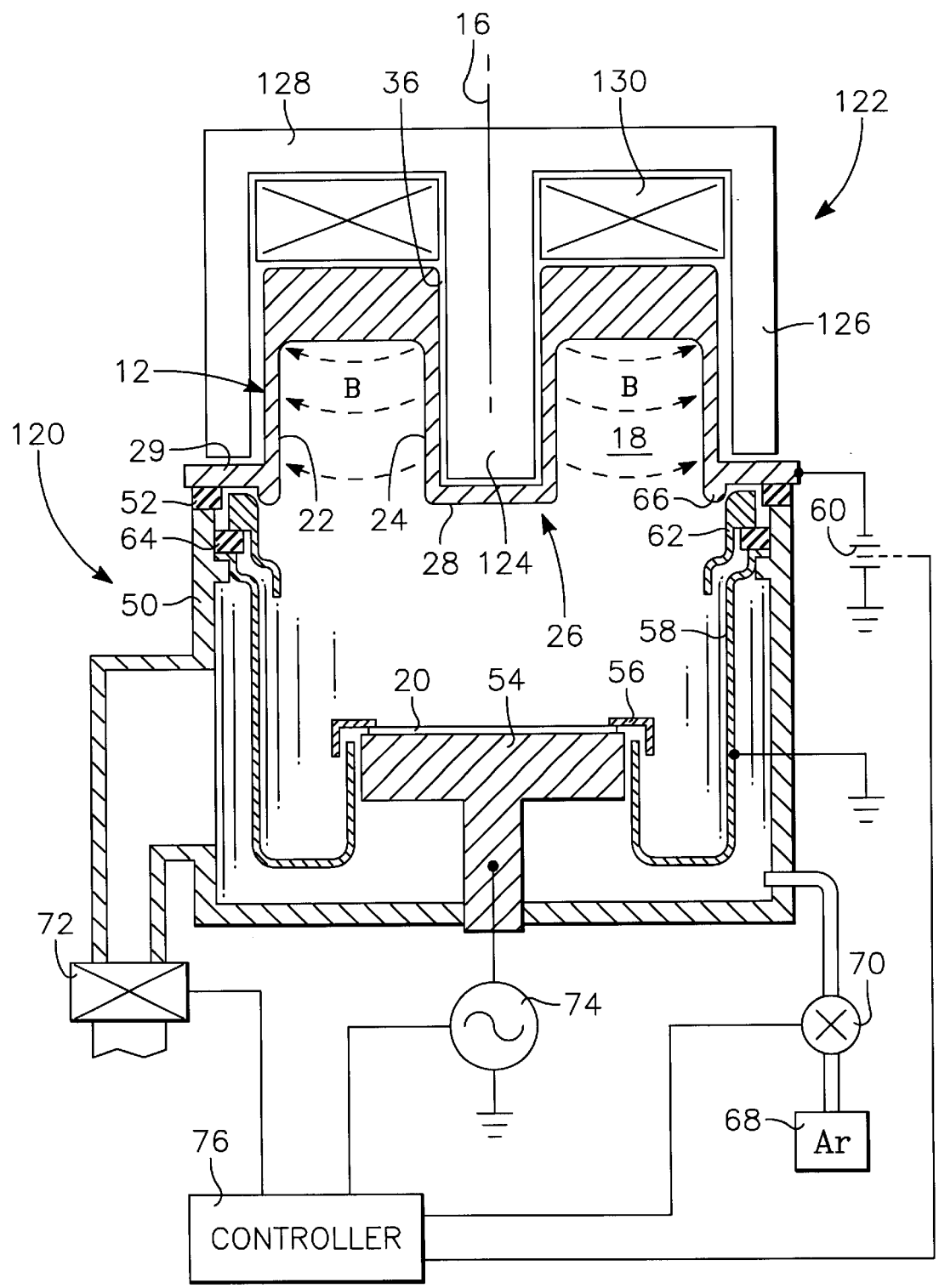
FIG. 5 is a schematic cross-sectional view of a fourth embodiment of a magnetron sputter reactor of the invention using an electromagnetic coil.

Electromagnetic coils may replace the permanent magnets of the previously described embodiments. A sputter reactor 120 of a fourth embodiment of the invention is illustrated in the schematic cross-sectional view of FIG. 5. A magnetron 122 includes a magnetic yoke including a central spindle 124 fit into the well 36 of the target 12 and a tubular rim 126 surrounding the outer sidewall 24 of the target vault 18. The magnetic yoke also includes a generally circular back piece 128 magnetically coupling the spindle 124 and the rim 126. An electromagnetic coil 130 is wound around the spindle 124 below the back piece 128 and inside of the rim 126. The coil 130 is preferably powered by a DC electrical source but a low-frequency AC source can be used. The coil 130 in conjunction with the magnetic yoke creates a generally radial magnetic field in the target vault 18.

The previously described embodiments have emphasized sputtering the vault sidewalls 22, 24 preferentially to sputtering the trough top wall or roof 25 (see FIG. 1) since relatively few of the magnetic field lines terminate on the vault roof 25. The metal ionization fraction can be increased if sputtering is increased in the vault roof 25 since the plasma thickness experienced by average sputtered atom is increased. Also, the collimation produced by the vault 18 is increased.

Figure 6:
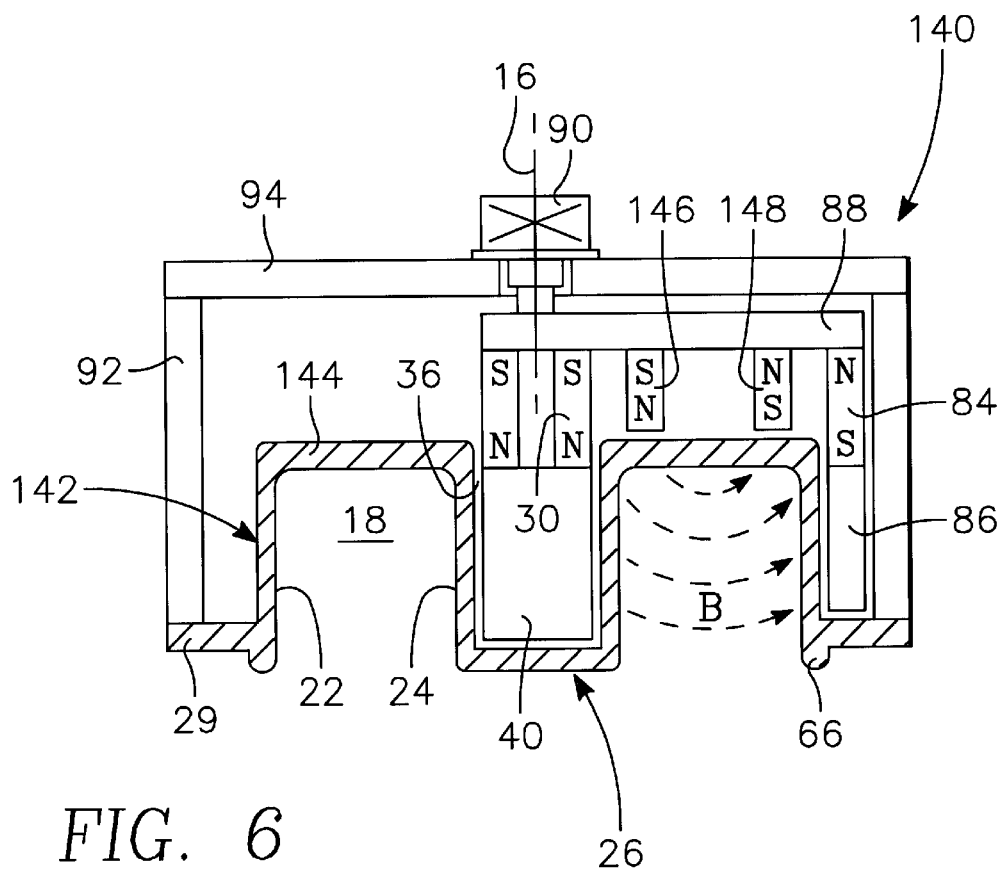
FIG. 6 is a cross-sectional view of a fifth embodiment of a magnetron of the invention using additional magnets at the roof of the vault to increase the roof sputtering.

The increased roof sputtering can be achieved in a number of ways. In a fifth embodiment of an magnetron 140 illustrated in cross-section in FIG. 6 with the remainder of the sputtering chamber being similar to the parts illustrated in FIG. 3. A target 142 is similar to the previously described target 12 except for a thinner roof portion 144. Similarly to the magnetron 82 of FIG. 3, it includes the rotatable yoke 88 supporting the inner magnets 30 of a first vertical polarization magnetically coupled to the inner pole piece 40 and the outer magnets 84 of a second vertical polarization magnetically coupled to the outer pole piece 86. These magnets 30, 84 and pole pieces 40, 86 produce a generally radial magnetic field B extending between the sidewalls 22, 24 of the vault 18. The magnetron 82 additionally supports on the magnetic yoke 88 an inner roof magnet 146 of the first vertical polarization aligned with the inner magnets 30 and an outer roof magnet 148 of the second vertical polarization aligned with the outer magnets 86. The opposed roof magnets 146, 148 magnetically coupled by the yoke 88 produce a semi-toroidal magnetic field B penetrating the vault roof 144 at two locations. Thereby, electrons are trapped along the semi-toroidal magnetic field and increase the plasma density near the vault roof 144, thereby increasing the sputtering of the trough roof 144.

In the illustrated embodiment, the outer magnets 84 and outer pole piece 86 occupy only a segment of the periphery of the target 142 but are rotated along that periphery by the motor 90. Similarly, inner and outer roof magnets 146, 148 extend only along a corresponding segment angle. However, a corresponding and probably preferred non-rotating magnetron can be created by making the roof magnets 146, 14, outer magnet 84, and outer pole piece 86 in annular shapes. The same circularly symmetric modification may be made to the embodiments described below.

Figure 7:
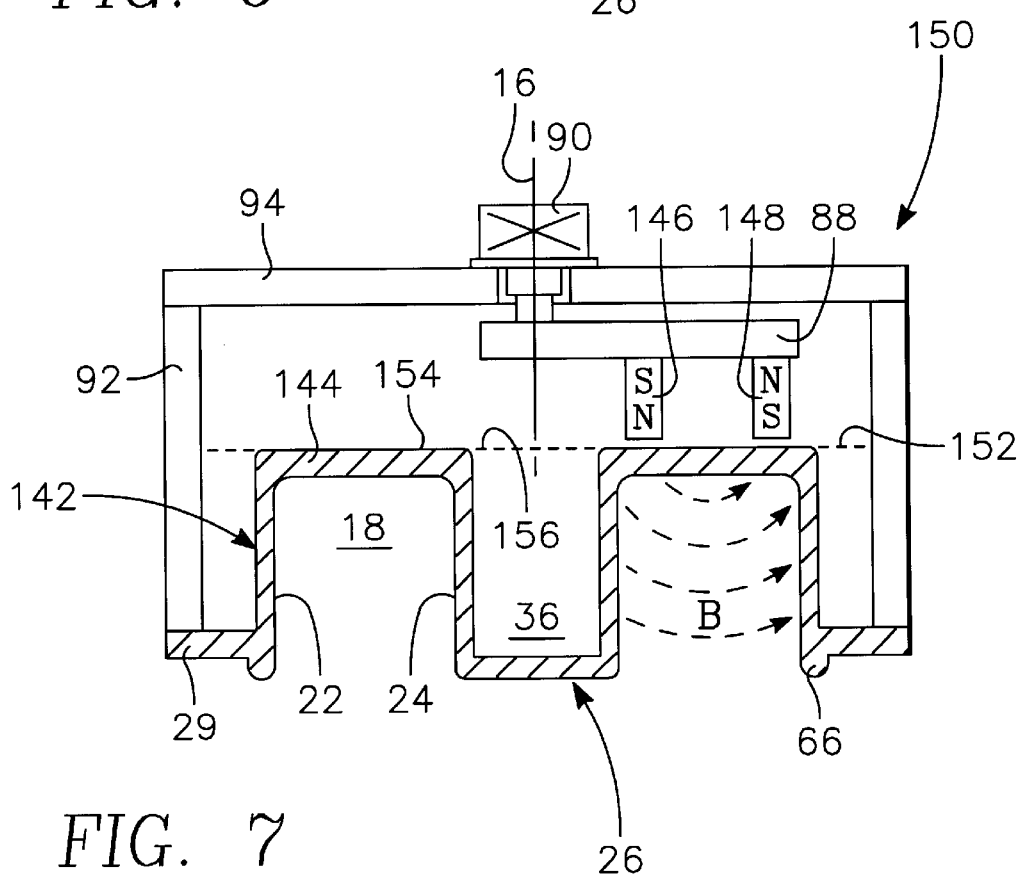
FIG. 7 is a cross-sectional view of a sixth embodiment of a magnetron of the invention using only the vault magnets.

The roof sputtering can be further emphasized by a sixth embodiment of a magnetron 150, illustrated in FIG. 7, which includes the inner and outer roof magnets 146, 148 but which in the illustrated embodiment includes neither the inner magnets within the well 36 nor the outer magnets outside of the outer sidewall 22. This configuration produces a relatively strong semi-toroidal magnetic field B adjacent to the trough roof 144 and a weaker magnetic field B in the body of the trough 18 adjacent to the sidewalls 22, 24. Therefore, there will be much more sputtering of the roof 144 than of the sidewalls 22, 24. Nonetheless, magnetic field lines in the trough body terminate at the sidewalls 22, 24, thereby decreasing electron loss out of the plasma. Hence, the magnetic field intensity may be low in the trough, but the plasma density is still kept relatively high there so that the target atoms sputtered from the roof 144 still traverse a thick plasma region and are accordingly efficiently ionized.

Since no magnets or pole pieces are placed in the target well 36 or outside of the outer target sidewall 22 and assuming the target material is non-magnetic, the inner and outer sidewalls 24, 22 may be increased in thickness even to the point that there is no well and no appreciable volume between the outer sidewall 22 and the chamber wall. That is, the back of the target 142 may have a substantially planar face 152, 154, 156. However, the inventive design of this embodiment still differs from a target having a circularly corrugated surface in that the spacing of the opposed roof magnets 146, 148 is at least half of the radial trough dimension and preferably closer to unity. This is in contrast to the embodiments of FIGS. 1, 3, and 4 in which the two sets of magnets are separated preferably by between about 100% and 150% of the trough width. Alternatively stated, the width of the trough 18 in the radial direction should be at least 2.5 cm and, preferably at least 5 cm. These dimensions, combined with the aspect ratio being at least 1:2 assures that the trough width is at least 10 times and preferably at least 25 times the plasma dark space, thus guaranteeing that the plasma conforms to the shape of the trough 18. These trough widths are easily accommodated in a sputter reactor sized for a 200 mm wafer. For larger wafers, more complex target shapes become even easier to implement.

Figure 8:
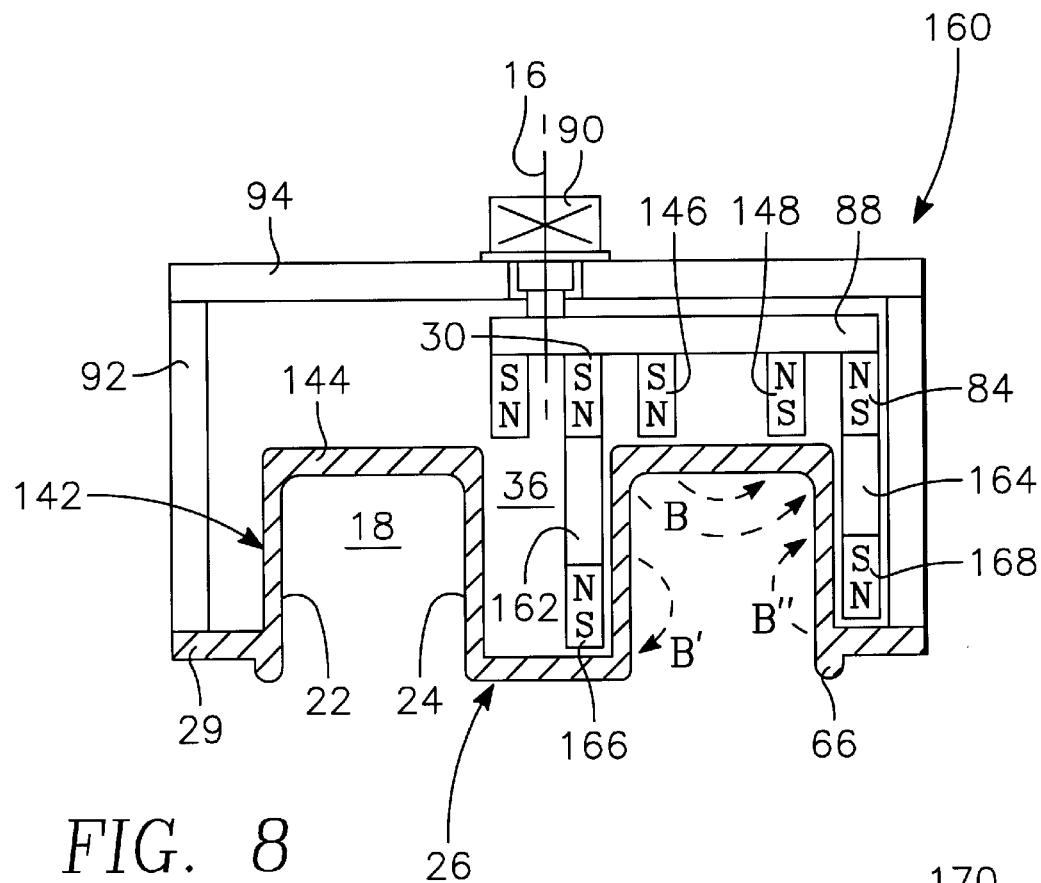
FIG. 8 is a cross-sectional view of a seventh embodiment of a magnetron of the invention using additional confinement magnets at the bottom sidewall of the vault.

A seventh embodiment of a magnetron 160 illustrated in the cross-sectional view of FIG. 8 includes the inner and outer main magnets 30, 84, although they are preferably somewhat shorter and do not extend below the vault roof 144. The magnetron also includes the inner and outer roof magnets 146, 148. However, neither the inner pole piece nor outer pole piece needs to be used to couple the magnetic field from the main magnets 30, 84 into the vault 18. Instead, all these magnets produce a horizontally oriented semi-toroidal field B adjacent the trough roof 144. Some of these magnets may be eliminated as long as there are opposed magnets associated with the inner and outer target sidewalls 22, 24. Instead of ferromagnetic or paramagnetic pole pieces, non-magnetic or even diamagnetic spacers 162 are supported below the inner and outer main magnets 30, 84 respectively. The inner spacer 162 supports on its lower end an sidewall inner magnet 166 of the second magnetic polarization, that is, opposite that of its associated main inner magnet 30. Similarly, the outer spacer 164 supports on its lower end an sidewall outer magnet 168 of the first magnetic polarization, that is, opposite that of its associated main outer magnet 84. Both the sidewall magnets 166, 168 are located near the bottom of the respective vault sidewalls 24, 22. Because, they have polarities opposed to those of their associated main magnets 30, 84 they create two generally vertically extending semi-toroidal magnetic fields B' and B" near the bottom of the trough sidewalls 24, 22. Because of their opposed magnetic orientations, the sidewall magnets 166, 168 create two unillustrated anti-parallel components of radial magnetic field across the trough 18. However, because of the relative spacings of the poles, the semi-toroidal magnetic fields B' and B" dominate.

In one sub-embodiment, the horizontally extending magnetic field B near the trough roof 144 is much stronger than the vertically extending magnetic fields B' and B" near the trough sidewalls 24, 22. As a result, sputtering of the roof 144 predominates. Alternatively, increased sidewall fields B' and B" can increase the amount of sidewall sputtering in a controlled way. In any case, the vertically extending sidewall fields B' and B" are sufficient to support a plasma throughout much of the body of the vault 18. Also, the sidewall fields B' and B" are oriented to repel electrons in the plasma flux from the roof 144, thereby decreasing the electron loss of that plasma.

Figure 9:
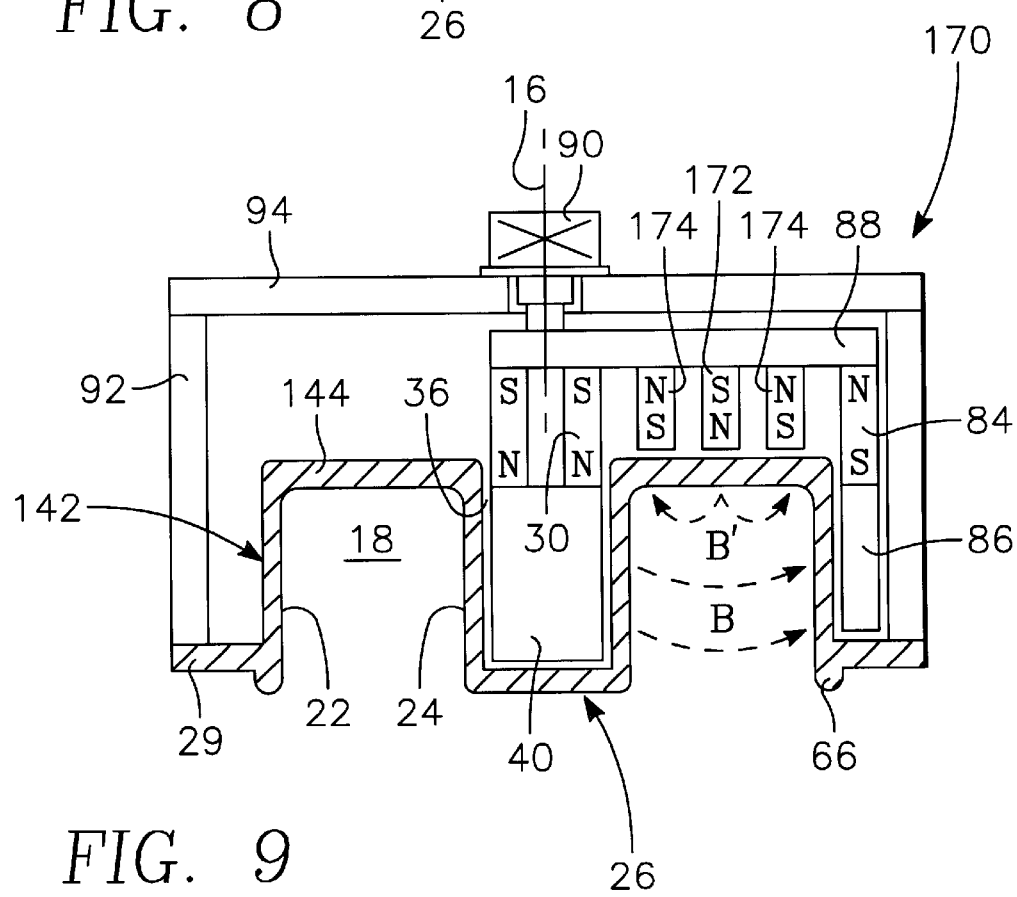
FIG. 9 is a cross-sectional view of an eighth embodiment of a magnetron of the invention using a closed magnetron over the trough roof and separate magnets for the vault sidewalls.

All of the previous embodiments have used magnets that extend generally along either the entire circumference or a segment of the circumference of various radii of the target. However, an eighth embodiment of a magnetron 170 illustrated in the cross-section view of FIG. 9 treats the planar vault roof 144 distinctly differently from the band-shaped vault sidewalls 22, 24. The sidewall magnetic assembly is similar to that of FIG. 6 and includes the rotatable yoke 88 supporting the inner magnets 30 of a first vertical polarization magnetically coupled to the inner pole piece 40 and the segmented outer magnets 84 of an opposed second vertical polarization magnetically coupled to the outer pole piece. These produce a generally radially directly magnetic field B across the trough 18. The rotating magnetic yoke 88 also supports a closed magnetron over the trough roof 144 including an inner magnet 172 of one vertical magnetic polarization and a surrounding outer magnet 174 of the other vertical magnetic polarization producing between them a cusp-shaped magnetic field B' adjacent the trough roof 144. In the simplest sub-embodiment, the inner magnet 172 is cylindrical, and the outer magnet 174 is annular or tubular producing a circularly symmetric cusp field B'. However, other shapes are possible, such as a radially or circumferentially aligned racetrack or a pair of nested segment-shaped magnets. The roof magnetron of FIG. 9 is the general type of magnetron described by Fu and by Chiang et al. in the previously referenced patent applications for SIP sputtering of a planar target, and those references provide guidance on the design of such a closed magnetron.

The figure does not adequately illustrate the magnetic yoke 88 which in the conceptually simplest implementation would magnetically isolate the roof magnets 172, 174, from the sidewall magnets 30, 84 while still magnetically coupling together the roof magnets 172, 174 and separately coupling together the sidewall magnets 30, 84. However, in view of the large number of magnets, a more complex magnetic circuit can be envisioned.

As has been shown in the cited patent applications, such a small closed roof magnetron will be very effective in highly ionized sputtering of the target roof 144. The sidewall magnets 30, 84 on the other hand will extend the plasma region down the height of the sidewalls 22, 24 as well as cause a degree of sidewall sputtering depending on the relative magnetic intensities.

The relative magnetic polarizations of roof magnets 172, 174 relative to those of the sidewall magnets 30, 84 may be varied. Also, the sidewall magnets 30, 84 and particularly the outer sidewall magnet 84 may be made fully annular so as to close on themselves so that optionally they do not need to be rotated and may be coupled by their own stationary yoke while the roof magnets 172, 174 do rotate about the circular planar area on the back of the trough roof 144 and are coupled by their rotating own yoke.

Other combinations of the closed roof magnetron and the sidewall magnets of other embodiments are possible.

It is thus seen that the complex geometry of the magnetron and target of the various embodiments of the invention provides additional controls on the intensity, directionality, and uniformity of sputtering.

It is possible to include multiple concentric troughs and to associate magnetic means with each of them.

It is also possible to additionally include an RF inductive coil to increase the plasma density in the processing space between the target and wafer. However, the unique configurations of the target and magnetron of the invention in large part eliminate the need for expensive coils.

Although the described embodiments have included a magnetron with a trough having vertical sidewalls and producing a substantially horizontal magnetic field in the trough. However, it is appreciated that the magnetic field cannot be completely controlled, and inclinations of the magnetic field up to about 25°. Furthermore, the sidewalls may form more of a V-shaped trough with sidewall slope angles of up to 25°, but a maximum of 10° is preferred.

Although the invention has been described with respect to sputtering a coating substantially consisting of the material of the target, it can be advantageously used as well for reactor sputtering in which a gas such as nitrogen or oxygen is supplied into the chamber and reacts with the target material on the wafer surface to form a nitride or an oxide.

What is claimed is:

1. A magnetron plasma sputter reactor, comprising:
    a plasma chamber arranged about a central axis and configured to accommodate a substrate to be sputter coated;
    a target around said central axis and having at least one annular vault disposed on a first side of said target facing said substrate and a well disposed on a back side of said target inside said vault, said vault having an annular inner sidewall, an opposed annular outer sidewall, and a top wall, an aspect ratio of a depth of said vault to a width of said vault being at least 1:2, said target being configured to received electrical power to create a plasma within said plasma chamber; and
    magnetic means disposed at least partially in said well to create a magnetic field having magnetic field lines extending from said inner sidewall to said outer sidewall.

2. The reactor of claim 1, wherein said magnetic means includes permanent magnets.

3. The reactor of claim 1, wherein said magnetic means includes an inductive coil.

4. The reactor of claim 1, where said magnetic means are disposed partially radially outside of said outer sidewall.

5. The reactor of claim 4, wherein said magnetic means are disposed partially above said top wall.

6. The reactor of claim 5, wherein the magnetic means disposed partially above said top wall includes a first magnetic pole of a first polarity and a second magnetic pole of a second polarity opposed to said first polarity and surrounding said first magnetic pole.

7. The reactor of claim 1, wherein said ratio is at least 1:1.

8. The reactor of claim 7, wherein said magnetic means includes permanent magnets disposed at least partially radially outside of said inner and outer sidewalls from said vault.

9. The reactor of claim 1, wherein said target extends through said vault and to within an area radially inward of said inner sidewall continuously with at least a homogeneous surface portion facing said substrate.

10. A magnetron plasma sputter reactor, comprising:
    a plasma chamber arranged about a central axis and configured to accommodate a substrate to be sputter coated;
    a target around said central axis and having at least one annular vault disposed on a first side of said target facing said substrate, said vault having a width in a radial direction with respect to said central axis, said target being configured to receive electrical power to create a plasma within said plasma chamber;
    a first permanent magnet of a first magnetic polarity along said axis arranged in back of said vault at a first radial distance from said central axis; and
    a second permanent magnet of a second magnetic polarity opposite said first polarity disposed in back of said vault at a second radial position from said central axis;
    wherein a difference of said first and second radial positions is between 50% and 150% of said width of said vault.

11. The sputter reactor of claim 10, wherein said difference is between 50% and 100% of said width, and said first and second magnets are positioned to create a magnetic flux penetrating a roof of said vault.

12. The sputter reactor of claim 10, wherein said difference is between 100% and 150% of said width, and said first and second magnets are positioned to create a magnetic flux penetrating both sidewalls of said vault.

13. A magnetron plasma sputter reactor, comprising:
    a plasma chamber arranged about a central axis and configured to accommodate a substrate to be sputter coated;
    a target arranged about said central axis and having at least one annular vault on a first side of said target facing said substrate, a central one of said vaults having an inner vertically extending annular sidewall enclosing a well accessible from a second side of said target and an outer vertically extending annular sidewall opposite said inner side wall, said target being continuous on said first side of said target within said inner sidewall;
    a first permanent magnet of a first magnetic polarity disposed in said well and producing a first magnetic field in said vault; and
    a second permanent magnet of a second magnetic polarity opposite said first magnetic polarity disposed radially outwardly of said outer sidewall and producing a second magnetic field in said vault.

14. The reactor of claim 13, wherein said second magnet extends only partially around a circumference of said outer sidewall.

15. The reactor of claim 14, wherein said second magnet extends circumferentially around said outer sidewall over an angle of between 20° to 90°.

16. The reactor of claim 14, further comprising a motor rotating at least said second magnet about said central axis.

17. The reactor of claim 13, wherein said first and second magnets are magnetized substantially parallel to said central axis and further comprising a magnetic yoke including two arms disposed on respective sides of a back yoke magnetically coupling said two arms.

18. The reactor of claim 13, wherein said central one of said vaults has an aspect ratio of at least 1:2.

19. The reactor of claim 18, wherein said aspect ratio is at least 1:1.

20. A magnetron plasma sputter reactor, comprising:
    a plasma chamber arranged about a central axis and configured to accommodate a substrate to be sputter coated;
    a target arranged about said central axis and having at least one annular vault on a first side of said target facing said substrate, a central one of said vaults having an inner vertically extending annular sidewall enclosing a well accessible from a second side of said target and an outer vertically extending annular sidewall opposite said inner side wall, said target being continuous on said first side of said target within said inner sidewall;

a first paramagnetic material disposed in said well and producing a first magnetic field in said vault;

a second paramagnetic material disposed radially outwardly of said outer sidewall and producing a second magnetic field in said vault;

first and second permanent magnets of opposite magnetic polarities magnetically coupled to said first and second materials on sides of the inner and outer sidewalls opposite said substrate.

21. A magnetron plasma sputter reactor, comprising:

a plasma chamber arranged about a vertically extending central axis and configured to accommodate a substrate to be sputter coated;

a target arranged about said central axis and an annular vault on a first side of said target facing said substrate, said vault having an inner vertically extending annular sidewall enclosing a well accessible from a second side of said target, an outer vertically extending annular sidewall opposite said inner side wall, and a roof connecting said inner and outer sidewalls on a side of said vault opposite said substrate;

a first magnetic pole of a first magnetic polarity disposed in said well;

a second magnetic pole of a second magnetic polarity opposite said first magnetic polarity disposed outside of said outer sidewall and magnetically coupled to said first magnetic pole;

a third magnetic pole of a third, vertical magnetic polarity disposed over said roof; and a fourth magnetic pole of a fourth, vertical magnetic polarity opposite said third magnetic polarity disposed over said roof and surrounding and magnetically coupled to said third magnetic pole;

wherein said third and fourth magnetic poles at any one time extend only partially around said central axis.

22. The reactor of claim 21, wherein said third and fourth magnetic poles are rotated about said central axis.

23. The reactor of claim 22, wherein said first and second magnetic poles are annularly shaped about and extend around said central axis.

24. The reactor of claim 23, wherein said first and second magnetic poles do not rotate.

25. The reactor of claim 21, wherein said first, second, third, and fourth magnetic poles include respective permanent magnets.

26. The reactor of claim 21, wherein said third magnetic pole overlies only said roof.

27. A sputter target adapted for use with a magnetron sputter reactor, being composed on a least a portion of a first side thereof of a material to be sputtered, and being shaped to have an annular vault on said first side having an aspect ratio of at least 1:2 and surrounding a central axis, a well on a second side of said target surrounded by and separated from said vault by an inner sidewall, an outer sidewall forming a radially outermost portion of said vault, a roof connecting said inner and outer sidewalls, an outer flange extending radially outwardly from an end of said outer sidewall opposite said roof for being sealed to a vacuum chamber of said reactor, and a cylindrical knob extending from a juncture of said flange and said outer sidewall away from said roof.

28. The target of claim 27, wherein said aspect ratio is at least 1:1.

29. A sputter target adapted for use with a magnetron sputter reactor, being composed of at least a portion of a first side thereof of a material to be sputtered, and being shaped to have an annular vault on said first side having an aspect ratio of at least 1:2 and surrounding a central axis and a radial width of at least 5 cm.

30. The sputter target of claim 9, wherein said radial width is at least 10 cm.

31. A magnetron plasma sputter reactor, comprising:

a plasma chamber arranged about a central axis and configured to accommodate a substrate to be sputter coated;

a target around said central axis and having an annular vault disposed on a first side of said target facing said substrate, said vault having a substantially tubular inner sidewall and a substantially tubular outer sidewall both extending substantially in parallel to said central axis and a roof connecting ends of said sidewall opposite said substrate, said target being configured to receive electrical power to create a plasma within said plasma chamber;

a permanent first magnet of a first magnetic polarity along said central axis arranged in back of said roof; and a permanent second magnet of a second magnetic polarity opposite said first magnetic polarity, surrounding said first magnet, arranged in back of said roof, and not extending at any one time completely around said central axis.

32. The reactor of claim 31, wherein said first and second magnets are rotatable about said central axis.

33. The reactor of claim 31, wherein said first and second magnets are substantially circularly symmetric about an axis passing through said roof.

34. The reactor of claim 31, further comprising third and fourth magnets of opposed magnetic polarities along said central axis arranged respectively in back of said inner and outer sidewalls opposite said vault.

35. The reactor of claim 34, wherein said first and second magnets are rotatable about said central axis.

* * * * *